(12) United States Patent
Seo et al.

(10) Patent No.: US 6,550,133 B1
(45) Date of Patent: Apr. 22, 2003

(54) SURFACE MOUNTING APPARATUS INSTALLED WITH TRAY FEEDER

(75) Inventors: Jae Bong Seo, Junrabuk-do (KR); Jae Hyuk Cho, Kyungki-do (KR)

(73) Assignee: Mirae Corporation, Choongchungnam-Do (KR)

( * ) Notice: Subject to any disclaimer, the term of this patent is extended or adjusted under 35 U.S.C. 154(b) by 0 days.

(21) Appl. No.: 09/512,599

(22) Filed: Feb. 25, 2000

(30) Foreign Application Priority Data

Feb. 27, 1999 (KR) .............................................. 99-3122
Feb. 27, 1999 (KR) .............................................. 99-6676

(51) Int. Cl.[7] .................................................. H05K 3/00
(52) U.S. Cl. ............................. 29/741; 29/740; 29/832; 414/416.05; 414/416.01; 414/752.1; 414/225.01; 901/47; 324/537
(58) Field of Search ........................... 414/752.1, 403, 414/404, 225.01, 416.01, 416.03, 226.03, 416.05, 416.06; 29/832, 739, 740, 741, 743, 837, DIG. 44; 901/47; 324/537

(56) References Cited

U.S. PATENT DOCUMENTS 5,379,514 A * 1/1995 Okuda et al. .................. 29/833
5,456,003 A * 10/1995 Yamamoto et al. ........... 29/840
5,894,657 A * 4/1999 Kanayama et al. ........... 29/740
5,907,900 A * 6/1999 Okazaki et al. ............... 29/740

FOREIGN PATENT DOCUMENTS

WO      WO 98/36629      * 8/1998    .................. 414/403

* cited by examiner

Primary Examiner—Frank E. Werner
(74) Attorney, Agent, or Firm—Fleshner & Kim, LLP

(57) ABSTRACT

The present invention relates to a surface mounting apparatus installed with a tray feeder in which a mounter is, at its one side, installed with a tape reel feeder and is, at its other side, installed with a tray feeder so that various semiconductor device can be, easily and rapidly, supplied.

17 Claims, 4 Drawing Sheets

SURFACE MOUNTING APPARATUS INSTALLED WITH TRAY FEEDER

BACKGROUND OF THE INVENTION

1. Field of the Invention

The present invention relates to a surface mounting apparatus in which a mounter is, at its one side, installed with a tape reel feeder and is, at its other side, installed with a tray feeder so that various semiconductor devices can be easily and rapidly supplied.

2. Description of the Prior Art

There has been a great deal of developments relating to surface mounting technology using a surface mounting apparatus for manufacturing a Printed Circuit Board (PCB).

The surface mounting apparatus is for mounting a surface mounting device on a PCB. The mounting apparatus is supplied with the surface mounting devices from a device supplier. The mounting apparatus then mounts the devices at mounting positions on the PCB.

Surface mounting apparatus can be divided into a high-speed apparatus and a general-use apparatus by function. The high-speed apparatus can accomplish a high-speed mounting operation because it is constructed to assemble many devices in a short time. Therefore, it has a merit in that it complies with mass production, however, its mounting precision is not good.

Meanwhile, the general-use apparatus can accomplish a high-precision because it is constructed to comply with many devices. Therefore, it has a merit in that it complies with a medium and small production quantities, however, its productivity is not good because of its low-speed mounting operation.

The surface mounting apparatus comprises a feeder (referred to as "a tape feeder" as below) for supplying a device to be mounted. The apparatus also includes an X-Y gantry for determining a working position, a conveyor for carrying a PCB to be worked, and a head for picking up, in regular sequence, the device from the feeder and for mounting the device on the PCB.

In general, the surface mounting apparatus serves to mount an electronic device on the PCB and can be called a mounter.

FIG. 1 is a perspective view showing a conventional surface mounting apparatus.

The conventional surface mounting apparatus is constructed such that a frame assembly 100 is installed to support the apparatus and is, at its upper portion, installed with a base assembly 102. The base assembly 102 is, at its upper portion, installed with a conveyor system 104 for feeding the printed circuit board and is, at its right side, installed with a tape reel feeder 122 for supplying various semiconductor devices.

The conveyor system 104 is, at its upper portion, installed with an X-Y gantry 106 for moving in left, right, forward and backward directions for mounting electronic devices on the PCB. The X-Y gantry 106 constructed with a gantry frame 109 to support the X-axis and Y-axis.

The gantry frame 109 is installed with a mounter head assembly 108 for mounting the devices on the PCB.

The tape feeder 122 is operated such that when a PCB is supplied by the conveyor system 104, and a tape reel serves a device to a reel receiving unit, the mounter head assembly 109 moves to pick up the semiconductor device and to mount the device on the PCB.

The mounter head assembly 109 is installed with a mounter head 107, which is installed with a suction nozzle 120 for sucking the device. The mounting head 107 is also installed with a vision unit 114 for checking whether the sucked device is mounted correctly on the PCB. Furthermore, the conveyor system 104 is installed with a stopper assembly 110 for stopping the PCB at the working position and is installed with a pusher 116 for moving the PCB upward and is, at its lower portion, installed with a magnet 118 for fixing the pusher 116 to the base 102.

However, the conventional surface mounting apparatus having the above construction has problems. Because the electronic deices are supplied only by the tape feeder, mounting operations can not be rapidly accomplished.

Furthermore, when different-sized devices must be mounted on a PCB, a working operation must be stopped to allow new tape reels served with appropriate sized devices to be hung to the tape reel receiving unit of the tape feeder.

SUMMARY OF THE INVENTION

The present invention solves the above problems. It is an object to provide a surface mounting apparatus which, at its one side, is installed with a tape reel feeder and is, at its other side, installed with a tray feeder so that various semiconductor devices can be easily and rapidly supplied.

To accomplish the above object, the present invention provides a surface mounting apparatus provided at its one side with a tape feeder and provided at its other side with a plurality of trays served with various semiconductor devices.

The tray feeder comprises: a supplying tray for supplying semiconductor devices to be mounted on a printed circuit board; a serving tray for positioning the device after it has been picked up by a mounter head; and a vision device for detecting whether the picked up device has the required mounting pins.

The tray feeder may also include a transfer device for feeding the trays served with the semiconductor chips. The transfer device includes a tray holding unit for moving a tray.

BRIEF DESCRIPTION OF THE DRAWINGS

Other objects and aspects of the invention will become apparent from the following description of embodiments with reference to the accompanying drawings in which.

DETAILED DESCRIPTION OF PREFERRED EMBODIMENTS

Figure 1:
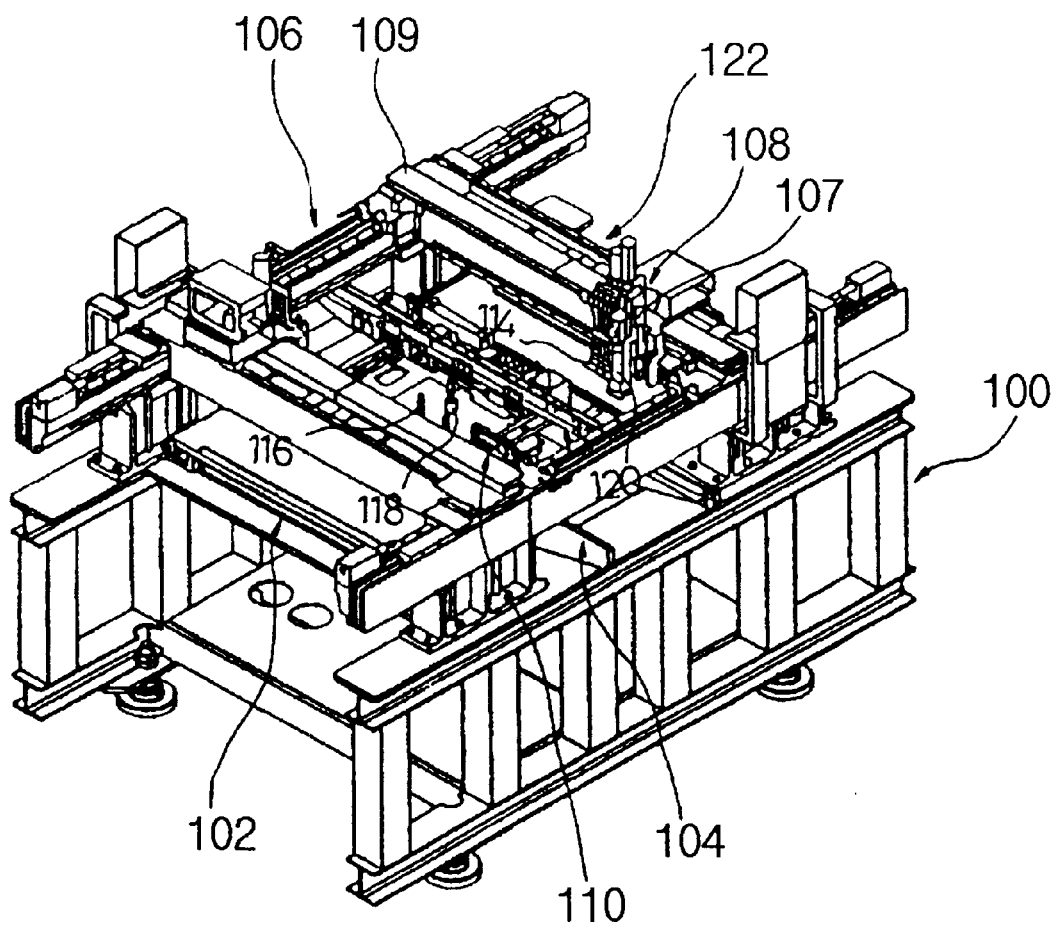
FIG. 1 is a perspective view showing a structure of a conventional surface mounting apparatus.

A surface mounting apparatus according to the present invention comprises: a frame assembly 200; a base assembly 202 installed at the upper portion of the frame assembly 200; a gantry 206 installed at the upper portion of the base assembly 202 for moving a mounting head assembly thereby to mount a device on a printed circuit board; a conveyor system 204 installed at the upper portion of the base assembly 202 for feeding the PCB; and a feeder for supplying the devices to be mounted on the PCB.

The surface mounting apparatus according to the present invention includes a tray feeder 208 provided on a side of the apparatus opposite the tape feeder and provided with trays having various semiconductor devices.

The tray feeder 208 comprises: a supplying tray 22 for supplying semiconductor devices to be mounted on a printed circuit board; a serving tray for positioning a step before being mounted the device sucked by the mounter head on the PCB; and a missing pin tray 20 for holding devices that have been determined to have missing pins.

The tray feeder 208 has a transfer for moving the test trays served with semiconductor chips between tray positions.

The transfer moves along the guide rail 16 of the transfer frame for continuously feeding trays being supplied from the tray feeder 208.

The transfer includes a tray holding unit 36 for picking up and moving the trays.

Figure 2:
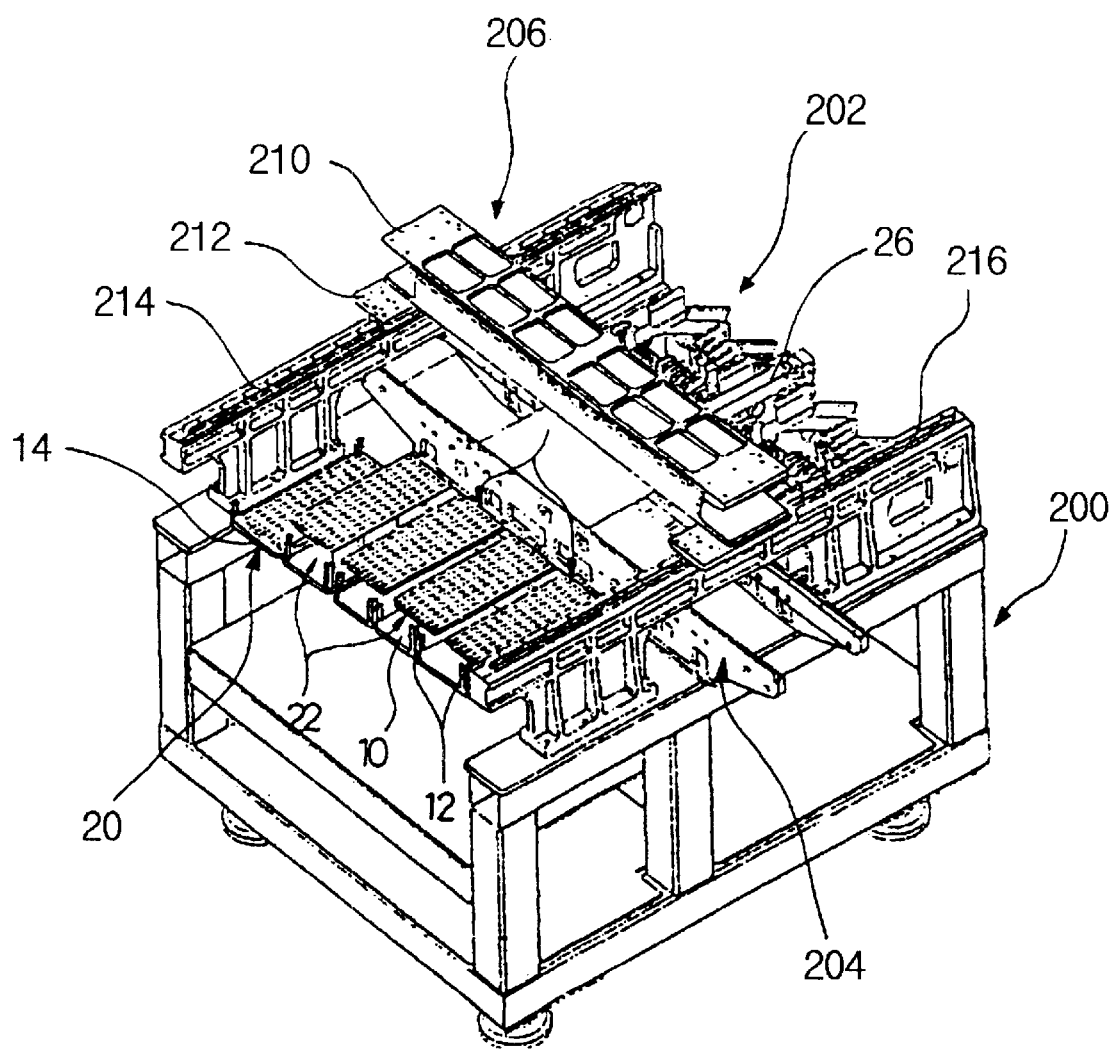
FIG. 2 is a perspective viewing showing a structure of a surface mounting apparatus installed with a tray feeder according to the present invention.
Figure 3:
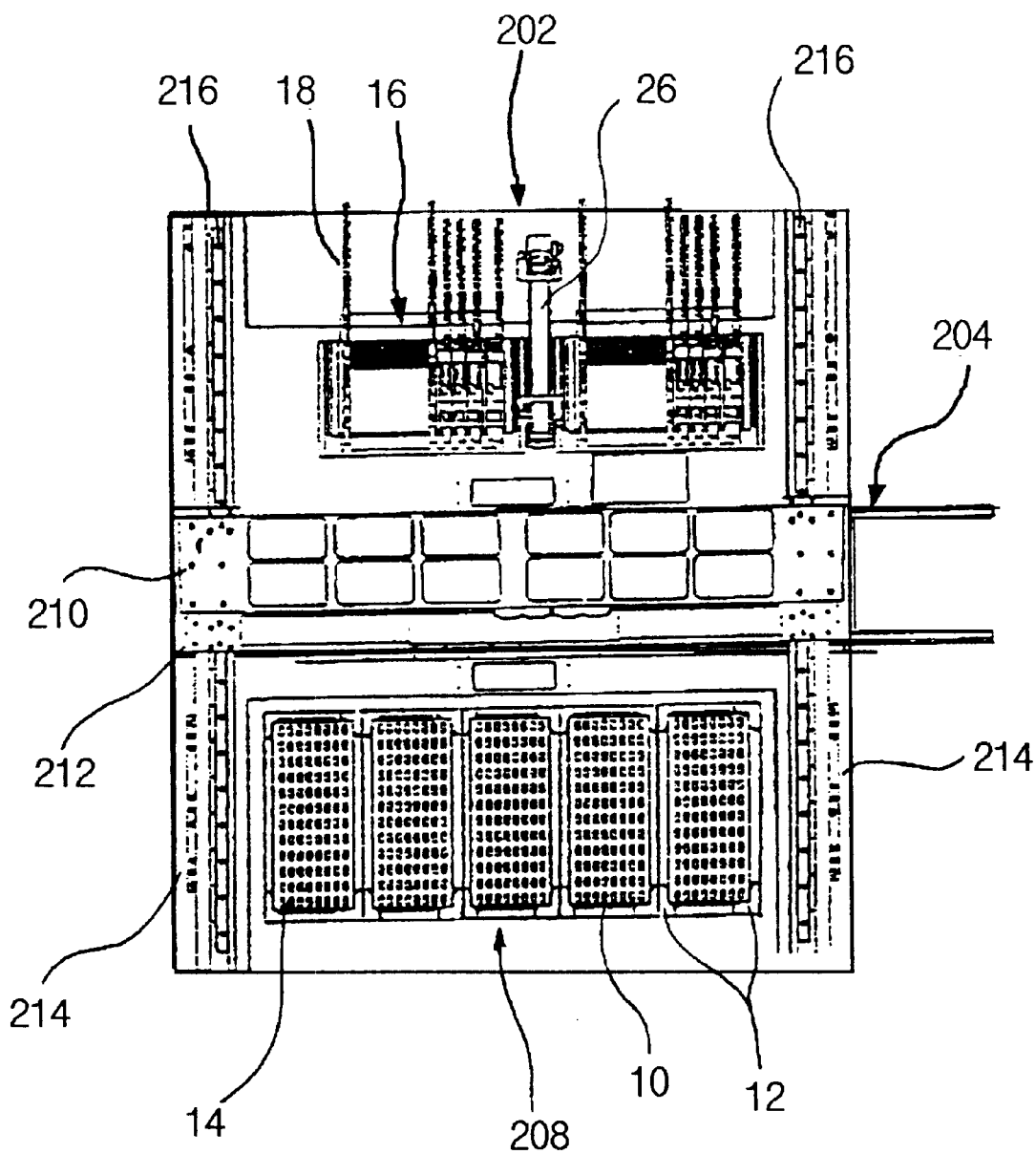
FIG. 3 is a plan view of FIG. 2.

FIG. 2 is a perspective view showing a structure of a surface mounting apparatus installed with a tray feeder according to the present invention; FIG. 3 is a plan view of FIG. 2; and FIG. 4 is a perspective view of a surface mounting apparatus according to an embodiment of the present invention.

Figure 4:
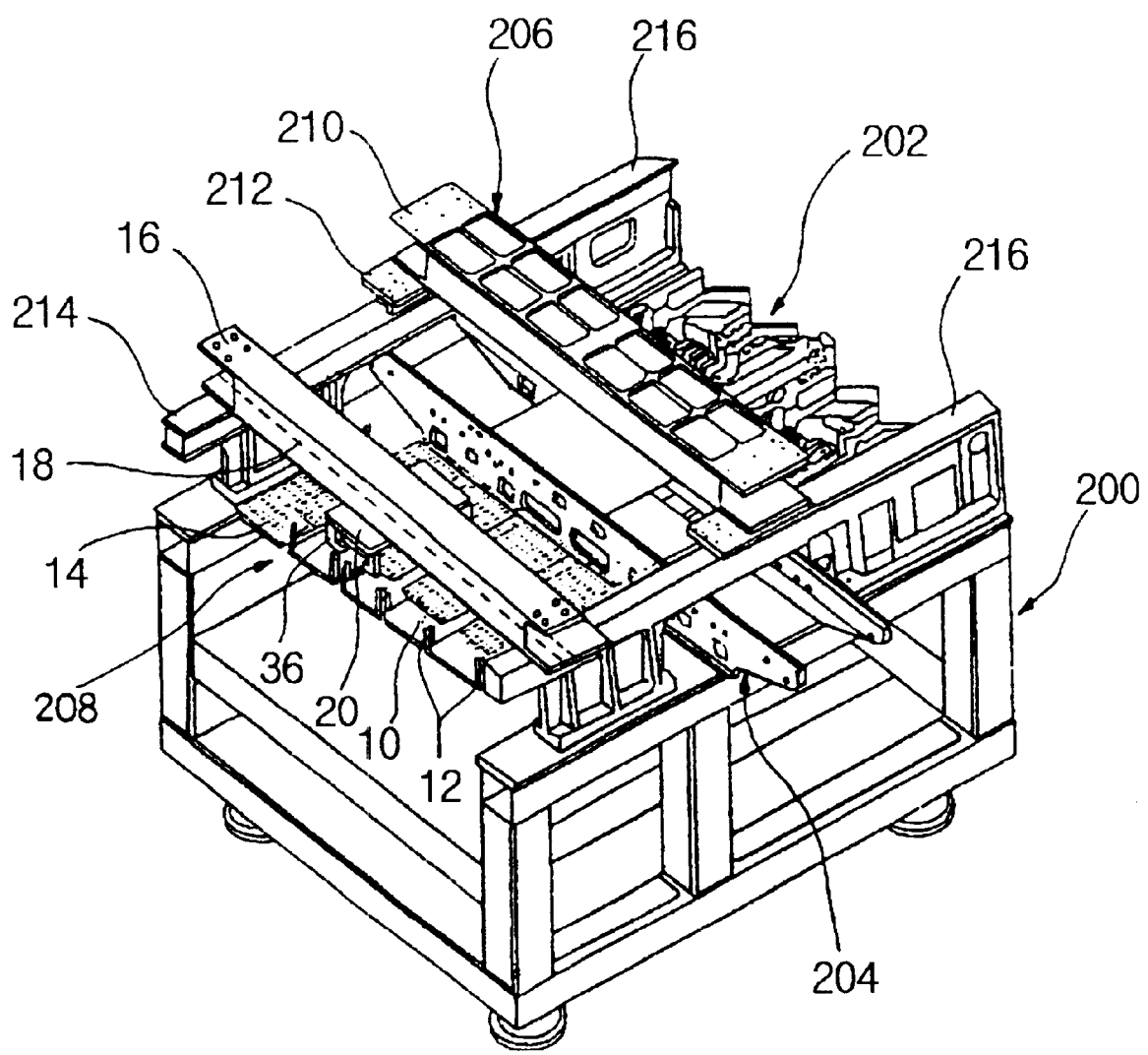
FIG. 4 is a perspective view of a surface mounting apparatus according to an embodiment of the present invention.

Referring to FIGS. 2, 3 and 4, a frame assembly 200 is disposed for supporting the surface mounting apparatus, and is, at the upper portion thereof, disposed with the conveyor system 204 for feeding the PCB.

The conveyor system 204 is, at the upper portion thereof, disposed with the gantry 206 for moving the devices in left and right directions to be mounted on the PCB. The gantry 206 is constructed with the frames 210 and 214 for supporting the X-axis and Y-axis.

At this time, the X-axis frame 210 is secured to the upper portion of the LM block 212 to slidingly move on the rail of the Y-axis frame 214.

The X-axis frame 210 is, at the right portion thereof, disposed with the tape feeder 202, which is able to receive the tape reels 18 having the semiconductor devices. The feeder 202 is disposed with a missing pin device conveyor 26. The conveyor 26 is for determining whether the device has a pin or not and for extracting the pin-missed device. Opposite the feeder 202 is disposed the tray feeder 208, which is able to supply, classify and stack the various devices.

The tray feeder 208 is disposed with one or more elevator plates 10 for going up and down under the action of a driving motor (not shown). Each elevator plate 10, at its four edges, is formed with tray guides 12 for preventing a tray being mis-positioned.

The tray received on an elevator plate 10 is disposed with two supply trays 22 to supply the semiconductor device. There are two supply trays 22 and two receiving trays disposed at every other position for locating the devices to be mounted on the PCB. The missed pin tray 20 for pin-missed semiconductor devices is located at one side for receiving devices with missing pins, which are detected when a mounting operation is attempted.

The tray transfer frame is, at is lower portion, disposed with the tray transfer device for locating the devices to be mounted on the PCB at particular positions on the tray feeder 208.

The tray transfer device is moved on the guide rail 16 formed at the lower portion of the transfer frame, thereby to move the trays 14 served with the devices toward the sucking position.

Furthermore, the tray holding unit 36 is provided on the transfer tray device, thereby to move the trays.

When a tray 14 is placed at the appropriate position, the device is sucked to be mounted on the PCB.

As the foregoing description according to the present invention makes clear, a greater variety of different semiconductor devices can be supplied by a tape feeder and a tray feeder, so that supplying and receiving operations can be continuously performed.

Furthermore, the tray feeder can be easily replaced, and its construction is simple, which increases a durability of the machine.

Having described a specific preferred embodiment of the invention with reference to the accompanying drawings, it is to be understood that various changes and modifications may be effected therein by one skilled in the art without departing from the scope of spirit of the invention, as defined in the appended claims.

What is claimed is:

1. A surface mounting apparatus, comprising:
   a surface mounting unit having an X-Y-Z range of motion for positioning components on a PCB;
   a tape feeder unit for supplying components to be mounted onto a PCB on at least one tape reel;
   a tray feeder unit for supplying components to be mounted onto a PCB in a plurality of component trays, wherein the tray feeder unit is configured to hold component trays at a plurality of different component pick-up positions, and wherein the tray feeder unit includes at least one elevator plate configured to raise and lower a component tray located at one of the plurality of pick-up positions; and
   a tray transfer device configured to move individual component trays between the plurality of different component pick-up positions, whereby the surface mounting unit picks up components from the at least one tape reel and the component tray and positions the components on a PCB.

2. The surface mounting apparatus of claim 1, wherein the tray transfer device includes a tray holding unit that is configured to pick up and hold a component tray as it is moved.

3. The surface mounting apparatus of claim 2, wherein the tray transfer device includes a transfer rail mounted over the plurality of pick-up positions, wherein the holding unit is slidably mounted on the transfer rail, and wherein the tray transfer device is configured so that the tray holding unit can pick up a component tray at a first position, move along the transfer rail, and then deposit the component tray at a second position.

4. The surface mounting apparatus of claim 1, wherein the at least one elevator plate is configured to raise a component tray at one of the pick-up positions to a position at which the tray transfer device can grasp the component tray.

5. The surface mounting apparatus of claim 1, wherein a plurality of component trays can be stacked on top of one another at each pick-up position, and wherein the at least one elevator plate is configured to move upward and downward so that the top-most component tray is held at a height that will allow a mounting head of the surface mounting unit to pick up components from the top-most component tray.

6. The surface mounting apparatus of claim 5, wherein the at least one elevator plate is also configured to raise a stack of component trays at one of the pick-up positions so that the tray transfer device can grasp the top-most component tray.

7. The surface mounting apparatus of claim 1, further comprising a vision device configured to detect whether mounting pins are missing from a component that has been grasped by a mounting head.

8. The surface mounting apparatus of claim 7, wherein the tray feeder unit includes a missing pin position, at which a component tray for holding components with missing pins can be located, and wherein the apparatus is configured such that if the vision device detects that pins are missing from a component, a mounting head of the surface mounting unit will then place the component in a component tray located at the missing pin position.

9. The surface mounting apparatus of claim 7, wherein the tray feeder unit includes a missing pin position, at which a component tray for holding components with missing pins can be located.

10. The surface mounting apparatus of claim 1, wherein the tray feeder unit is also configured to hold a stack of component trays at a supply position, and wherein the tray transfer device is configured to move component trays from the supply position to at least one of the plurality of pick-up positions.

11. The surface mounting apparatus of claim 10, wherein an elevator plate is located at each of the plurality of pick-up positions, each elevator plate being movable upward and downward, and wherein a plurality of component trays can be stacked on top of each elevator plate at each pick-up position.

12. The surface mounting apparatus of claim 11, wherein each elevator plate is configured such that when the tray transfer device moves a component tray from the supply position to a pick-up position, the elevator plate over which the tray has been placed will move downward so that the new component tray placed over the elevator plate will be positioned to allow a mounting head to grasp components held in the component tray.

13. A surface mounting apparatus, comprising:
   a surface mounting unit having an X-Y-Z range of motion for positioning components on a PCB;
   a tape feeder unit for supplying components to be mounted onto a PCB on at least one tape reel;
   a tray feeder unit for supplying components to be mounted onto a PCB in a plurality of component trays, wherein the tray feeder unit has a plurality of component pick-up positions where component trays can be stacked, and a plurality of supply positions wherein component trays can be stacked, wherein the tray feeder unit includes at least one elevator plate configured to raise and lower a component tray located at one of the plurality of pick-up positions; and
   a tray transfer device, including:
      a transfer rail mounted over the plurality of pick-up positions and the plurality of supply positions, and
      a tray holding unit, mounted on the transfer rail, and configured to pick up a component tray from one of the supply positions, move along the transfer rail, and deposit the component tray at one of the pick-up positions, whereby the surface mounting unit picks up components from the at least one tape reel and the component tray and positions the components on a PCB.

14. The mounting apparatus of claim 13, wherein the tray feeder unit includes a plurality of elevator plates, one elevator plate being located at each of the pick-up positions and supply positions, wherein each elevator plate is configured to move upward and downward to raise and lower component trays placed on the elevator plates.

15. The surface mounting apparatus of claim 13, further comprising a vision device configured to detect whether mounting pins are missing from a component that has been grasped by a mounting head.

16. The surface mounting apparatus of claim 15, wherein the tray feeder unit includes a missing pin position, at which a component tray for holding components with missing pins can be located, and wherein the apparatus is configured such that if the vision device detects that pins are missing from a component, a mounting head will then place the component in a component tray located at the missing pin position.

17. The surface mounting apparatus of claim 13, wherein the tray feeder unit includes a missing pin position, at which a component tray for holding components with missing pins can be located.

* * * * *